United States Patent [19]

Kawai

[11] Patent Number: 4,889,829
[45] Date of Patent: Dec. 26, 1989

[54] METHOD FOR PRODUCING A SEMICONDUCTOR DEVICE HAVING A SILICON-ON-INSULATOR STRUCTURE

[75] Inventor: Shinichi Kawai, Tokyo, Japan

[73] Assignee: Fujitsu Limited, Kawasaki, Japan

[21] Appl. No.: 297,376

[22] Filed: Jan. 17, 1989

[30] Foreign Application Priority Data

Jan. 18, 1988 [JP] Japan .................................... 63-6850

[51] Int. Cl.[4] ...................... H01L 21/76; H01L 21/84
[52] U.S. Cl. .......................................... 437/69; 357/49
[58] Field of Search ....................... 437/61, 69, 70, 21; 357/49

[56] References Cited

U.S. PATENT DOCUMENTS

| 4,217,153 | 8/1980 | Fukunaga et al. | 437/69 |
| 4,221,044 | 9/1980 | Godejahn, Jr. | 437/69 |
| 4,221,045 | 9/1980 | Godejahn, Jr. et al. | 437/69 |

FOREIGN PATENT DOCUMENTS

| 54-0000990 | 1/1979 | Japan | 437/69 |
| 57-0010248 | 1/1982 | Japan | 437/69 |
| 60-245211 | 12/1985 | Japan . | |

OTHER PUBLICATIONS

Hattori et al., "Characterization of Three Monoclonal Antibodies (VAK3-5) That Identify p24, Core Protein of Human Immunodeficiency Virus, and its Precursors", Jpn. J. Cancer Res. (Gann), 78 (1987) 235–241.
Caruso et al., "Liquid Competition Radioimmunoassay for the Detection and Quantitation of the HIV p24", J. Virol. Meth., 17 (1987) 199–210.
Higgins et al., "Detection and Differentiation by Sandwich Enzyme-Linked Immunosorbent Assay of Human T-Cell Lymphotropic Virus Type III/Lymphadenopathy-Associated Virus-and Acquired Immunodeficiency Syndrome-Associated Retroviruslike Clinical Isolates" J. Clin. Microbiol., 24 (1986) 424–430.
Kanki et al., "Serologic Identification and Characterization of a Macaque T-Lymphotropic Retrovirus Closely Related to HTLV-III", Science, 228 (1985) 1199–1201.
Ferns et al., "Characterization of Monoclonal Antibodies Against the Human Immunodeficiency Virus (HIV) Gag Products and Their Use in Monitoring HIV Isolate Variation", J. Gen. Virol., 68 (1987) 1543–1551.

*Primary Examiner*—Olik Chaudhuri
*Attorney, Agent, or Firm*—Armstrong, Nikaido Marmelstein, Kubovcik & Murray

[57] ABSTRACT

A method for producing a semiconductor device having a silicon-on-insulator structure, includes the steps of depositing a first insulation film on a silicon substrate by a chemical vapor deposition process, patterning said first insulation film so as to be left in a silicon-on-insulator (SOI) element region, a portion of said silicon substrate having no first insulation film thereon being served as a bulk element region, depositing a polysilicon layer on an entire surface of said silicon substrate, patterning said polysilicon layer so as to be left on said patterned first insulation film, a patterned polysilicon layer being served as an active region, and simultaneously forming second and third insulation films for use in element insulation in said silicon substrate and said patterned polysilicon layer, respectively, by a local-oxidation-of-silicon (LOCOS) process, so that said bulk element region in surrounded by said second insulation film, and said SOI element region is surrounded by said third insulation film.

6 Claims, 4 Drawing Sheets

METHOD FOR PRODUCING A SEMICONDUCTOR DEVICE HAVING A SILICON-ON-INSULATOR STRUCTURE

BACKGROUND OF THE INVENTION

The present invention generally relates to a method for producing a semiconductor device having a silicon-on-insulator (SOI) structure, and in particular, to a method for producing a semiconductor device having a bulk element region and a silicon-on-insulator element region.

A semiconductor device having a bulk element region and a silicon-on-insulator element region, or a bulk-SOI hybrid integrated circuit device has advantages of excellent crystallization of a bulk and excellent element insulation of the silicon-on-insulator (SOI) structure. For example, logic circuits are formed in bulk element regions in a semiconductor substrate, and output circuits having a high-voltage withstanding output driving force are formed in SOI element regions formed on the semiconductor substrate.

In a conventional method for producing such a semiconductor device, a local oxidation of silicon (hereafter simply referred to as a LOCOS) process is carried out two times. First, an insulation film is formed which is used for electrically insulating bulk element regions from each other, and secondly another insulation film is formed which is used for electrically insulating SOI element regions from each other and for electrically insulating the SOI element regions from the bulk substrate. Additionally, since the LOCOS process is based on thermal oxidation, a long time is taken to form an insulation film for element insulation. As a result, the production yield of the conventional method is low.

Generally, an underlying insulation layer on which a polysilicon layer of an active layer is formed, is formed by the thermal oxidation process. By this process, it is actually difficult to form a thick underlying insulation film. Generally, there is a limitation of thickness up to approximately 1 to 2 $\mu$m. With the thickness of the underlying insulation layer equal to approximately 1 $\mu$m, it is found that the polysilicon layer on the underlying insulation layer may be destroyed when a voltage of an approximately 200 volts is applied between the semiconductor substrate and a drain formed in the polysilicon layer on the underlying insulation film. From this viewpoint, it is required to form the underlying insulation layer as thick as possible.

SUMMARY OF THE INVENTION

It is therefore a general object of the present invention to provide a method for producing a semiconductor device having a silicon-on-insulator structure in which the aforementioned disadvantages are eliminated.

A more specific object of the present invention is to provide a method capable of providing a semiconductor device having a silicon-on-insulator structure of a high-voltage withstanding property and high reliability with a decreased number of production steps.

The above objects of the present invention can be achieved by a method for producing a semiconductor device having a silicon-on-insulator structure comprising the steps of depositing a first insulation film on a silicon substrate by a chemical vapor deposition process, patterning the first insulation film so as to be left in a silicon-on-insulator (SOI) element region, a portion of the silicon substrate having no first insulation film thereon being served as a bulk element region, depositing a polysilicon layer on an entire surface of the silicon substrate, patterning the polysilicon layer so as to be left on the patterned first insulation film, a patterned polysilicon layer being served as an SOI active region, and simultaneously forming second and third insulation films for use in element insulation in the silicon substrate and the patterned polysilicon layer, respectively, by a local-oxidation-of-silicon (LOCOS) process, so that the bulk element region is surrounded by the second insulation film, and the SOI element region is surrounded by the third insulation film.

Other objects, features and advantages of the present invention will become apparent from the following detailed description when read in conjunction with the accompanying drawings.

DETAILED DESCRIPTION

Figure 1:
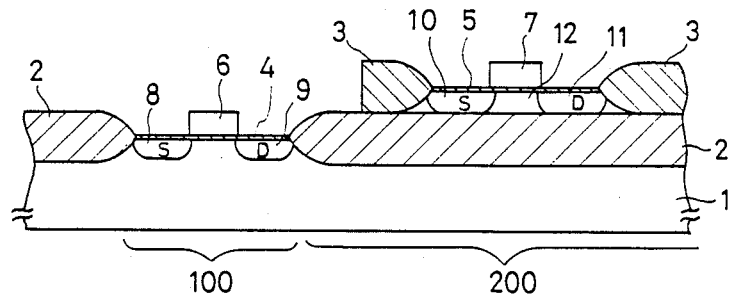
FIG. 1 is a cross sectional view of a conventional semiconductor device having a silicon-on-insulator structure.

To facilitate the understanding of the present invention, a description is given of a conventional method for producing a semiconductor device having a silicon-on-insulator structure with reference to FIG. 1.

Referring to FIG. 1, a field insulation film 2 for use in element insulation is formed on a silicon substrate 1 by the LOCOS process. Next, a gate oxidation film 4 is grown on the silicon substrate 1 by a thermal oxidation process. Then a polysilicon film is deposited by the chemical vapor deposition process. Normally, the polysilicon film is doped with an impurity in order to provide it with conductivity of a predetermined conduction type. Thereafter, the polysilicon film is patterned so as to form a polysilicon layer 12 formed on the field insulation film 2. Then a field insulation film 3 is formed around the polysilicon layer 12 by the LOCOS process. After that, a gate insulation film 5 is formed on the silicon layer 12. Although the gate insulation film 4 has already been formed as described above, it may be formed before forming the gate electrode 6. Then gate electrode 6 and 7 are formed on the gate oxidation films 4 and 5, respectively. Finally, source regions 8 and 10, and drain regions 9 and 11 are formed by diffusing an impurity into the silicon substrate 1 and the polysilicon layer 12 by the self-alignment process in which the gate electrodes 6 and 7 are used as mask films. A reference 100 indicates a bulk element region, and a reference 200 indicates a SOI element region.

However, since the LOCOS process based on the thermal oxidation process must be performed two times, the production yield is low. In addition, the withstanding voltage for a SOI element depends on the thickness of the underlying field insulation film 2. When a high voltage is applied across the silicon substrate 1 and the drain region 11, the polysilicon layer 12 is greatly affected by the potential of the silicon substrate 1. At this time, in a case where the underlying field insulation film 2 is thin, breakdown may occur in the polysilicon layer 12, so that the SOI element may be broken. For example, with the underlying filed insulation film 2 equal to approximately 1 $\mu$m, it is found that breakdown occurs in the polysilicon layer 12 when a voltage of about 200 volts is applied between the drain region 11 and the silicon substrate 1. For this reason, it is required to form a thicker underlying field insulation film 2. However, there is actually a limitation of thickness up to approximately 1 to 2 $\mu$m because of the following reasons. First, the underlying field insulation film 2 is made by the LOCOS process. In the LOCOS process, at the time of thermal oxidation, nitrogen atoms contained in the $Si_3N_4$ film used as the oxidation-resistant film may be diffused into a region other than the $Si_3N_4$ film. In order to prevent the diffusion, the oxidation temperature is set to a low temperature. Therefore, an extremely long time is taken to form the insulation ($SiO_2$) film to a thickness of 1 to 2 $\mu$m. Secondly the silicon wafer which provides a number of silicon substrates 1 may be destroyed during the thermal oxidation process if the underlying field insulation film is grown over 1 to 2 $\mu$m. Consequently, it is actually impossible to form the insulation film ($SiO_2$) to a thickness of 1 to 2 $\mu$m.

The present invention aims to eliminate the above-mentioned disadvantages of the conventional method. The present invention employs chemical vapor deposition by which an underlying insulation film for the SOI structure is formed.

The inventor is aware of the prior art disclosed in the Japanese Laid-Open Patent Application No. 60-245211. The prior art discloses the insulation film for the SOI structure is formed by chemical vapor deposition. However, the prior art does not disclose an essential feature of the present invention in which insulation films for bulk element insulation and SOI element insulation are formed at the same time. Further, the prior art does not disclose another feature of the present invention in which a thermal oxidation film which underlies the SOI structure. Moreover, it will be seen from the following description that the present invention provides other essential features which are not suggested by the prior art.

A description is given of a preferred embodiment of the present invention with reference to FIGS. 2A through 2E.

Figure 3:
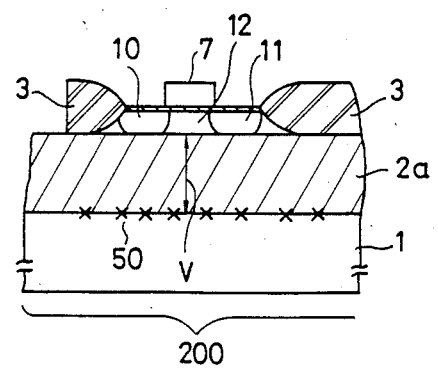
FIG. 3 is a cross sectional view illustrating a problem caused in the conventional semiconductor device having the SOI structure in which a CVD insulation film is formed directly on a silicon substrate.
Figure 2A:
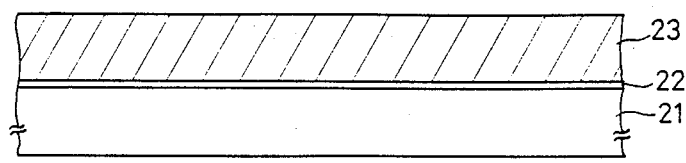
FIGS. 2A through 2E are cross sectional views illustrating different steps of a preferred embodiment of the present invention.

Referring to FIG. 2A, an underlying thermal oxidation film 22 made of silicon dioxide is formed on a main surface of a silicon substrate 21 to a thickness of approximately 0.1 $\mu$m by the thermal oxidation process in which thermal oxidation is carried out at an HCl atmosphere at 1000° C. for 110 minutes, for example. The presence of the underlying thermal oxidation film 22 aims to improve state of an interface between a CVD insulation film 23 and the silicon substrate 21. This is described by referring to FIG. 3. FIG. 3 shows a structure in which a CVD insulation film 2a is formed directly on the silicon substrate 1. In this case, capture centers 50 are formed at an interface of the CVD insulation film 2a and the substrate 1, as taught by the above-mentioned prior art. The capture centers 50 function to capture charges located in the vicinity of the interface. Therefore a difference V in potential between top and bottom surfaces of the CVD insulation film 2a is not fixed but varied. This causes electric instability of SOI devices, or sometimes a leakage current may pass through the CVD insulation film 2a. The presence of the underlying thermal oxidation film 22 decreases capture centers and thereby eliminates the above-mentioned problems As a result, by using the underlying thermal oxidation film 22, it becomes possible to obtain a stabilized potential difference and thus a stabilized electrical properties. Further, an increased high-voltage withstanding property is obtainable. It is desirable to use the underlying thermal oxidation film 22.

Then, the CVD insulation film 23 is formed on the underlying thermal oxidation film 22 by chemical vapor deposition. A material used for forming the CVD insulation film 23 is silicon oxide ($SiO_2$, PSG, BSG), for example. It is suitable for forming the CVD insulation film 23 to a thickness of approximately 2 to 4 $\mu$m. An example of the condition of the CVD process is as follows: reaction gas; $SiH_4+N_2O$, pressure; 1 Torr, temperature; 800° C., and time; 6 to 12 hours.

Figure 2B:
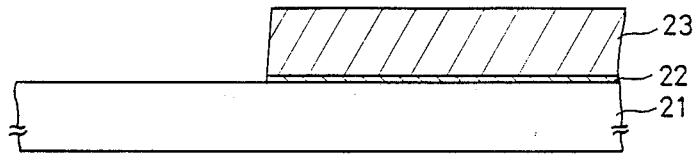
Figure 2C:
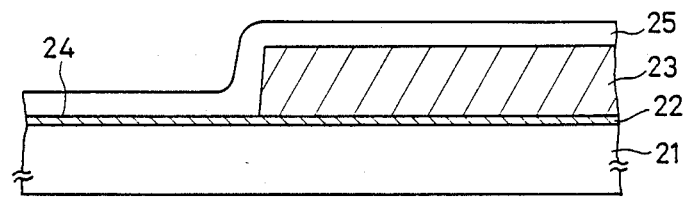
Figure 2D:
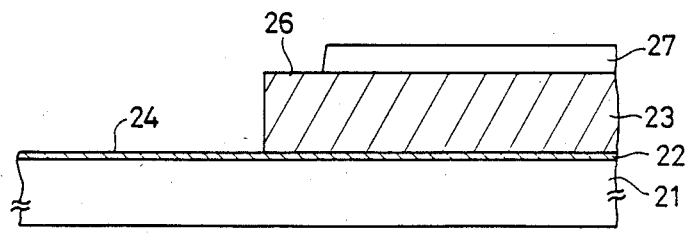
Figure 2E:
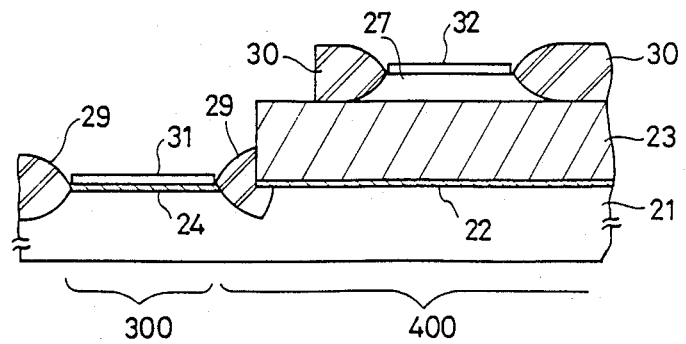

Next, as shown in FIG. 2B, by using the photoresist process, the CVD insulation film 23 and the underlying thermal oxidation film 22 are etched so as to leave only a portion thereof corresponding to an SOI element region 400 (FIG. 2E). An example of the etching condition is as follows: reaction gas; $CF_3$, Rf power; 1.1 kW, and pressure; 0.1 Torr.

Then, as shown in FIG. 2C, the entire surface of the silicon substrate 21 is subjected to thermal oxidation in which the silicon substrate 21 is placed in HCl atmosphere for 110 minutes, for example. Thereby, a protection insulation film 24 of silicon dioxide having a thickness of approximately 0.1 $\mu$m is formed on the entire surface of the silicon substrate 21. The protection insulation film 24 functions as an etching stopper in the subsequent etching step in which a polysilicon film 25 used for forming a polysilicon layer for the SOI structure is etched. That is, etching selectivity can be enhanced. However, the protection insulation film 24 is not an essential film, and may be omitted. In this case, etching of the polysilicon film 25 is stopped when the silicon substrate 21 and the CVD insulation film 22 become exposed. After forming the protection insulation film 24, as shown in FIG. 2C, the above-mentioned polysilicon film 25 is deposited to a thickness of approximately 0.5 $\mu$m by chemical vapor deposition. An example of the process condition is as follows: reaction gas; $SiH_4$, pressure; 0.5 Torr, temperature; 625° C., and temperature; up to 50 minutes.

It is preferable that the polysilicon film 25 is doped with an impurity in order to reduce the resistance thereof. For example, the impurity has a conduction type identical to that of the silicon substrate 21. In a case where the silicon substrate 21 is of the p-type, a p-type impurity such as boron is introduced into the polysilicon film 25.

Thereafter, as shown in FIG. 2D, the polysilicon film 25 is etched so as to leave a portion thereof on the CVD insulation film 23. That is, a portion of the polysilicon film 25 formed on a bulk element region 300 and a bulk-SOI boundary region 26, is removed. An example of the etching condition is as follows: reaction gas; $CF_4+O_2$, Rf power; 1kW, and pressure; 1 Torr. In the etching process, the protection insulation film 24 is served as an etching stopper. Similarly, the CVD insulation film 23 is also served as an etching stopper. In this manner, a polysilicon layer 27 of an active layer is formed in the SOI element region 400. It is preferable to recrystallize the polysilicon layer 25 by using a laser beam. It is noted that in a case where the polysilicon film is used as it is, the mobility of charges may decrease, and an increased leakage current may pass through an interface of the polysilicon film 27 and the CVD insulation film 22. The recrystallization applied to the polysilicon layer 27 makes it possible to prevent the above-mentioned shortcomings. The laser beam may be substituted with an electron beam or an ultraviolet ray.

Figure 4:
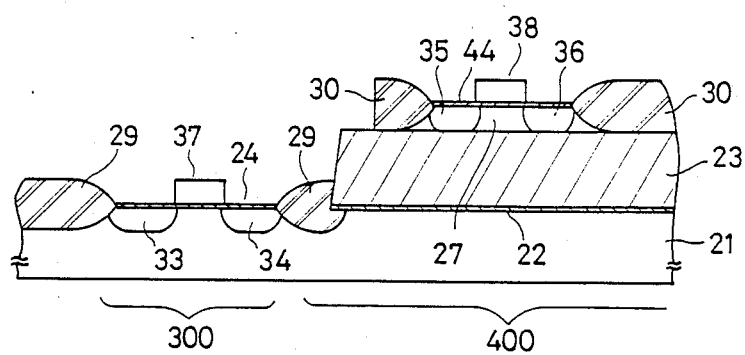
FIG. 4 is a cross sectional view of a semiconductor device fabricated by the steps of the embodiment shown in FIGS. 2A through 2E.

Then, as shown in FIG. 2E, element insulation films for the bulk element region 300 and the SOI element region 400 are formed at the same time by the conventional LOCOS process. LOCOS insulation films 29 are used for electrically insulating the bulk element region 300 from other regions (not shown). LOCOS insulation films 30 are used for electrically insulating the SOI element region 400 from other regions. In the LOCOS process, oxidation-resistant films 31 and 32 are formed on the protection insulation film 24 and the polysilicon film 27, respectively. Each of the oxidation-resistant films 31 and 32 consists of an oxide film and a nitride film. Then the silicon substrate 21 is thermally oxidized. Thereby, thick LOCOS insulation films 29 and 30 are formed. Thereafter, the oxidation-resistant films 31 and 32 are removed in their entirety by etching in which etching conditions are as follows: reaction gas; $CF_4$, Rf power; 800W, and pressure 0.1 Torr. Steps following the step of FIG. 2E are the same as related steps of the conventional production process. For example, as shown in FIG. 4, a gate oxidation film 44 is formed on the polysilicon layer 27. Then gate electrodes 37 and 38 are formed on the gate insulation films 24 and the 44, respectively. Then, source regions 33 and 35 and drain regions 34 and 36 are formed in the silicon substrate 21 and the polysilicon layer 27 by the self-alignment process in which the gate electrodes 37 and 38 are mask films.

It is confirmed that in a case when the CVD insulation film 23 is formed to a thickness of 4 μm, even when a voltage exceeding 200 volts is applied across the silicon substrate 21 and the drain electrode 36, no anormal state such as breakdown occurs, and it becomes possible to ensure a sufficient high-voltage withstanding.

It can be seen from the above-mentioned description that according to the present invention, insulation films for the bulk element region and the SOI element region are formed at one time by the thermal oxidation process. As a result, a reduced number of production steps is obtainable, and additionally thermal stress for the device is reduced.

Figure 5:
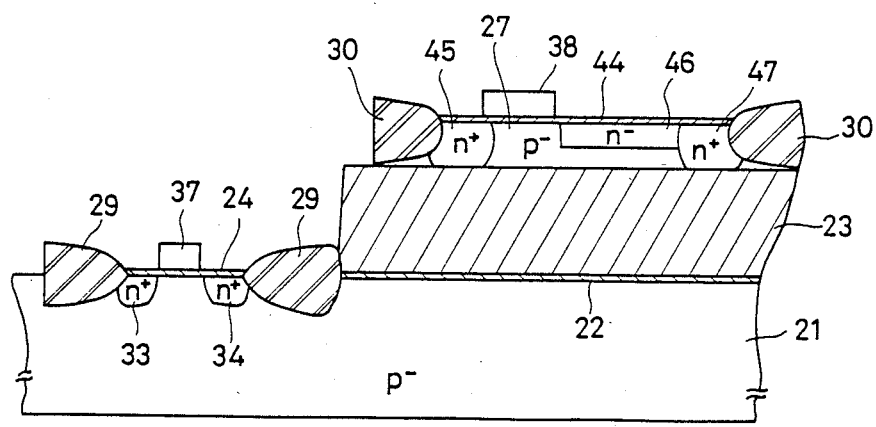
FIG. 5 is a cross sectional view of a variation of the semiconductor device obtainable by the present invention.

In the above-mentioned embodiment, a MOS transistor is formed in the polysilicon region 27. Actually, as shown in FIG. 5, the polysilicon film 27 of $p^-$-type has $n^+$-type diffusion regions 45 and 47, and an $n^-$-type diffusion region 46. The silicon substrate 21 is of $p^-$-type, and the source and drain regions 33 and 34 are of $n^+$-type In place of MOS transistors, it is possible to form a bipolar transistor in the polysilicon layer 27.

In cases when an interconnection layer of aluminum or the like is formed so as to connect a bulk element and an SOI element, there is a probability in which disconnection occurs in the interconnection layer due to a level difference between the bulk element region 300 ad the SOI element region 400. In order to prevent the disconnection from occurring in the interconnection layer, it is preferable to perform one of two processes, one of which consists of steps shown in FIGS. 6A, 6B and 6C, and the other consists of steps shown in FIGS. 6A, 6D and 6E.

Figure 6A:
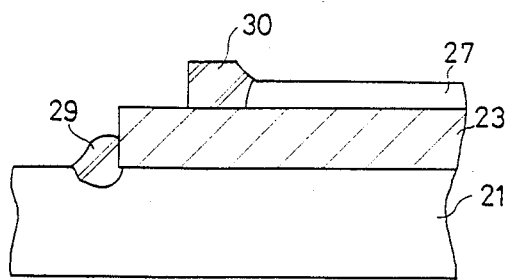
FIGS. 6A through 6E are cross sectional views illustrating variations of the process of the present invention.

Referring to FIG. 6A, there is a level difference of approximately 4 μm between the bulk element region 300 and the SOI element region 400. In detail, a stepped portion exists between the LOCOS insulation film 30 and the CVD insulation film 23, and another stepped portion exists between the CVD insulation film 23 and the silicon substrate 21. As shown in FIG. 6B, the stepped portions are coated with a liquid insulation film 39 such as SOG (spin on glass) so as to connect the bulk element region 300 and the SOI element region 400 with a gently-sloping sidewall. Thereafter, an interconnection layer 28 of aluminum or the like extending over the regions 300 and 400 is formed on the liquid insulation film 39.

Figure 6D:
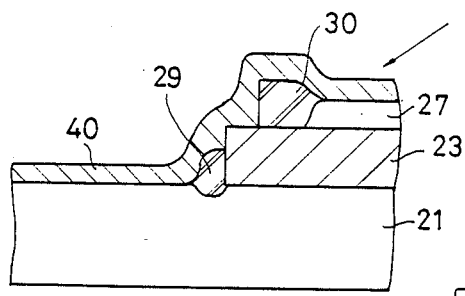
Figure 6B:
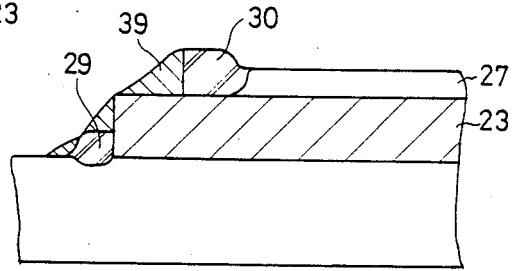
Figure 6E:
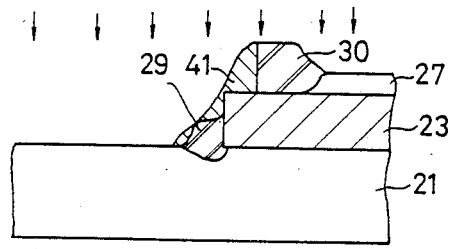
Figure 6C:
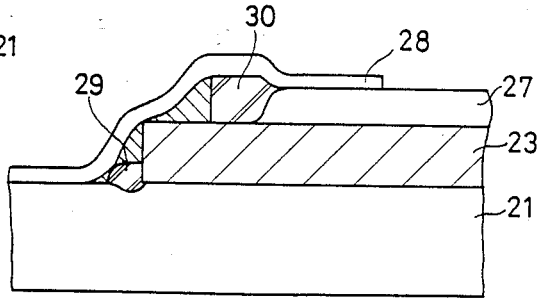

In the alternative, as shown in FIG. 6D, a silicon dioxide film 40 is deposited on the stepped portions by chemical vapor deposition. Then, as shown in FIG. 6E, the deposited silicon dioxide film 40 is selectively etched by reactive ion etching, so that a gently-sloping sidewall film 41 of silicon dioxide is formed. Finally, the interconnection layer 28 is formed on the sidewall 41 as in the case of FIG. 6E.

The present invention is not limited to the above-mentioned embodiments, and variations and modifications may be made without departing from the scope of the present invention.

What is claimed is:

1. A method for producing a semiconductor device having a silicon-on-insulator structure, comprising the steps of:
    depositing a first insulation film on a silicon substrate by a chemical vapor deposition process;
    patterning said first insulation film so as to be left in a silicon-on-insulator (SOI) element region, a portion of said silicon substrate having no first insulation film thereon serving as a bulk element region;
    depositing a polysilicon layer on the entire surface of said silicon substrate;
    patterning said polysilicon layer so as to be left on said patterned first insulation film, a portion of said patterned polysilicon layer serving as an active region; and
    simultaneously forming second and third insulation films for use in element insulation in said silicon substrate and said patterned polysilicon layer, respectively, by a local-oxidation-of-silicon (LOCOS) process, so that said bulk element region is surrounded by said second insulation film, and said SOI element region is surrounded by said third insulation film.

2. A method as claimed in claim 1, wherein said silicon substrate comprises a thermal oxidation film formed thereon, and said first insulation film is formed on said thermal oxidation film.

3. A method as claimed in claim 1, further comprising a step of forming a thermal oxidation film on the portion of said silicon substrate having no first insulation film thereon, and then the step of depositing the polysilicon layer is carried out.

4. A method as claimed in claim 1, further comprising a step of forming a sidewall film in a stepped portion between said bulk element region and said SOI element region.

5. A method as claimed in claim 1, further comprising a step of recrystallizing said patterned polysilicon layer.

6. A method as claimed in claim 1, wherein said polysilicon layer comprises impurity-doped polysilicon.

* * * * *